(12) United States Patent
Zhang et al.

(10) Patent No.: US 10,147,870 B2
(45) Date of Patent: Dec. 4, 2018

(54) POROUS PIEZOELECTRIC MATERIAL WITH DENSE SURFACE, AND ASSOCIATED METHODS AND DEVICES

(71) Applicant: THE TRUSTEES OF DARTMOUTH COLLEGE, Hanover, NH (US)

(72) Inventors: John X. J. Zhang, Hanover, NH (US); Dajing Chen, Hanover, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 15/526,713

(22) PCT Filed: Nov. 12, 2015

(86) PCT No.: PCT/US2015/060342
§ 371 (c)(1),
(2) Date: May 12, 2017

(87) PCT Pub. No.: WO2016/077560
PCT Pub. Date: May 19, 2016

(65) Prior Publication Data
US 2017/0317269 A1 Nov. 2, 2017

Related U.S. Application Data

(60) Provisional application No. 62/078,627, filed on Nov. 12, 2014.

(51) Int. Cl.
*H01L 41/04* (2006.01)
*H01L 41/047* (2006.01)
(Continued)

(52) U.S. Cl.
CPC .......... *H01L 41/193* (2013.01); *H01L 41/047* (2013.01); *H01L 41/0805* (2013.01);
(Continued)

(58) Field of Classification Search
CPC . H01L 41/193; H01L 41/047; H01L 41/0805; H01L 41/45
(Continued)

(56) References Cited

U.S. PATENT DOCUMENTS

| | | | | | |
|---|---|---|---|---|---|
| 4,686,409 | A | * | 8/1987 | Kaarmann | G10K 11/02 310/326 |
| 5,142,187 | A | * | 8/1992 | Saito | B06B 1/0622 310/334 |

(Continued)

FOREIGN PATENT DOCUMENTS

| | | | | | |
|---|---|---|---|---|---|
| EP | 0979686 | A2 | * | 2/2000 | B06B 1/06 |
| JP | 7250399 | A | * | 9/1995 | H04R 17/00 |

(Continued)

OTHER PUBLICATIONS

International Search Report and Written Opinion dated Apr. 25, 2016 for International Patent Application No. PCT/US2015/060342—7 pgs.

(Continued)

*Primary Examiner* — Thomas Dougherty
(74) *Attorney, Agent, or Firm* — Lathrop Gage LLP

(57) ABSTRACT

A method for producing a porous piezoelectric polymer film with a dense surface, includes depositing a polymer solution onto a substrate to form a polymer film including a solvent; evaporating a portion of the solvent to form the dense surface away from the substrate; forming water droplets in interior of the polymer film; and substantially evaporating the water droplets and remaining solvent to form porous interior. A piezoelectric composition includes a piezoelectric material with a porous interior and a dense surface for interfacing with an electrode. A piezoelectric device includes a first electrode; a porous piezoelectric film with a dense surface and porous interior, wherein the porous piezoelectric film is deposited on the first electrode and the dense (Continued)

surface is away from the first electrode; and a second electrode deposited on the dense surface for, together with the first electrode, providing an electrical interface for the porous piezoelectric film.

13 Claims, 11 Drawing Sheets

(51) Int. Cl.
| | | |
|---|---|---|
| *H01L 41/193* | (2006.01) | |
| *H01L 41/45* | (2013.01) | |
| *H01L 41/09* | (2006.01) | |
| *H01L 41/113* | (2006.01) | |
| *H01L 41/08* | (2006.01) | |

(52) U.S. Cl.
CPC ............ *H01L 41/09* (2013.01); *H01L 41/113* (2013.01); *H01L 41/1132* (2013.01); *H01L 41/45* (2013.01)

(58) Field of Classification Search
USPC .................................. 310/311, 358, 365, 800
See application file for complete search history.

(56) References Cited

U.S. PATENT DOCUMENTS

| | | |
|---|---|---|
| 5,761,782 A | 6/1998 | Sager |
| 5,834,107 A | 11/1998 | Wang et al. |
| 5,992,032 A * | 11/1999 | Chiang ................... G01C 9/06 33/365 |
| 2004/0138323 A1 | 7/2004 | Stenzel-Rosebaum et al. |
| 2010/0207490 A1 | 8/2010 | Chuang |
| 2011/0021916 A1 | 1/2011 | Morita |
| 2011/0181155 A1* | 7/2011 | Gabl ................... H01L 41/0838 310/366 |

FOREIGN PATENT DOCUMENTS

| | | | |
|---|---|---|---|
| JP | WO-2011/099319 A1 * | 8/2011 | ............... H03H 9/17 |
| JP | 2016072355 A * | 5/2016 | ............... H01G 7/02 |
| WO | WO 2010/144057 | 12/2010 | |

OTHER PUBLICATIONS

Chen et al., "Mesoporous surface control of PVDF thin films for enhanced piezoelectric energy generation." Sensors and Actuators A 216 (2014) 1967201, (Jun. 2014 (Jun. 2014), 196-200.

Orlov et al., "pH-Responsive Thin Film Membranes from Poly(2-vinylpyridine): Water Vapor-induced Formation of a Microporous Structure." Macromolecules 2007, 40, Jan. 2007 (Jan. 2007), pp. 2086-2089.

Derjaguin et al., "Effect of contact deformations on the adhesion of particles," Journal of Colloid and Interface Science, 1975, 53(2):pp. 314-326.

Derjaguin et al., "Effect of contact deformations on the adhesion of particles," Department of Surface Phenomena, Institute of Physical Chemistry, Academy of Sciences, Moscow, U.S.S.R., 1975, pp. 131-143.

\* cited by examiner

POROUS PIEZOELECTRIC MATERIAL WITH DENSE SURFACE, AND ASSOCIATED METHODS AND DEVICES

CROSS-REFERENCE TO RELATED APPLICATIONS

The present application is a 35 U.S.C. § 371 filing of International Application No. PCT/US2015/060342, filed Nov. 12, 2015, which claims the benefit of priority from U.S. Provisional Application Ser. No. 62/078,627 filed Nov. 12, 2014, each of which is incorporated herein by reference in its entirety.

U.S. GOVERNMENT SUPPORT

This invention was made with government support under contracts ECCS 1128677 and ECCS 1309686 awarded by the National Science Foundation. The government has certain rights in the invention.

BACKGROUND

A piezoelectric material generates an electric charge in response to an applied mechanical stress. This so-called piezoelectric effect may be utilized to generate a voltage across the surfaces where the mechanical forces are applied to the piezoelectric material. The piezoelectric effect is reversible such that a voltage applied across piezoelectric material results in a dimensional change of the piezoelectric material. By way of the piezoelectric effect, piezoelectric materials convert mechanical energy into electrical energy and vice versa. Importantly, piezoelectric materials with millimeter or even micron-sized dimensions may perform useful energy conversion. Furthermore, piezoelectric materials are relatively inexpensive. Piezoelectric materials are used in, for example, motors, energy harvesting devices, and sensors.

In a piezoelectric motor, a voltage bias is applied across a piezoelectrical material to change a dimensional property of the piezoelectric material. For example, application of an oscillating voltage bias produces a dimensional oscillation such as a repeating expansion and contraction of the piezoelectric material.

In the emerging technology of piezoelectric-based energy harvesting, a piezoelectric material is placed in an ambient environment that applies pressure to the piezoelectric material, resulting in production of electricity. In one example, a piezoelectric-based energy-harvesting device is embedded in a walkway to harvest energy from pressure applied to the walkway by pedestrians, or mounted to a person to harvest energy from dimensional changes of the piezoelectric material caused by the person moving. In another example, the rotation of a wind turbine with a diameter of only about ten centimeters flexes a piezoelectric material to produce electricity. The efficiency with which a piezoelectric material converts mechanical energy into electrical energy affects the output power of an energy-harvesting device and is therefore a critical parameter.

A piezoelectric pressure/stress sensor produces a voltage across the piezoelectric material in response to pressure or stress exerted on the piezoelectric material. The sensitivity of such a sensor is determined by the magnitude of pressure/stress required to produce a measurable voltage.

SUMMARY

In an embodiment, a method for producing a porous piezoelectric polymer film with a dense surface, includes (a) depositing a polymer solution onto a substrate to form a polymer film including a solvent, (b) evaporating a portion of the solvent to form the dense surface, wherein the dense surface is located away from the substrate, (c) forming water droplets in interior of the polymer film, and (d) substantially evaporating the water droplets and remaining solvent to form porous interior.

In an embodiment, a piezoelectric composition includes a piezoelectric material with a porous interior and a dense surface for interfacing with an electrode, wherein the dense surface has density greater than the porous interior.

In an embodiment, a piezoelectric device includes (a) a first electrode, (b) a porous piezoelectric film with a dense surface and porous interior, wherein the porous piezoelectric film is deposited on the first electrode and the dense surface is away from the first electrode, and (c) a second electrode deposited on the dense surface for, together with the first electrode, providing an electrical interface for the porous piezoelectric film.

DETAILED DESCRIPTION OF THE EMBODIMENTS

Figure 1:
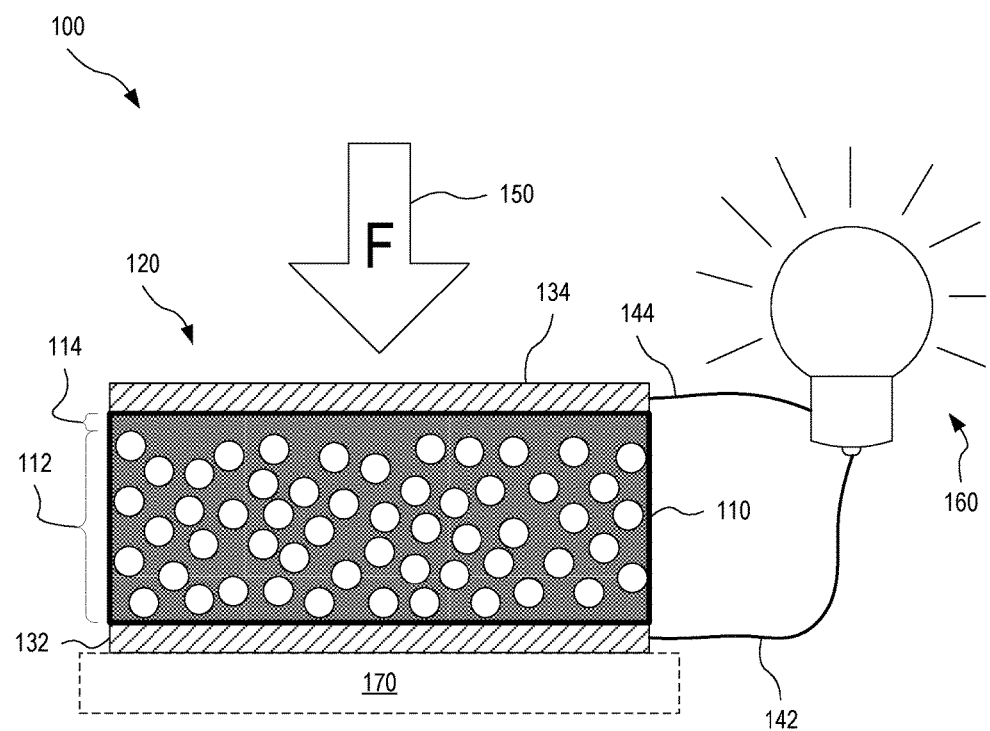
FIG. 1 illustrates, in a use scenario, a porous piezoelectric material having a dense surface, according to an embodiment.

FIG. 1 illustrates, in cross-sectional sideview, one exemplary porous piezoelectric material 110, having a dense surface, as implemented in an exemplary use scenario 100. Porous piezoelectric material 110 has a porous interior 112 and a dense surface 114. Dense surface 114 is denser and less porous than porous interior 112. Porous interior 112 and dense surface 114 cooperate to produce a highly efficient piezoelectric material. Porous interior 112 is highly compressible and dense surface 114 ensures high electromechanical coupling efficiency. Dense surface 114 allows a piezoelectric device to utilize the high compressibility of porous interior 112 without pore-induced loss of electromechanical coupling efficiency. Dense surface 114 thus represents an improvement over prior art porous piezoelectric materials.

Porous piezoelectric material 110 is integrally formed such that porous interior 112 and dense surface 114 result from processing of one connected material, as opposed to porous interior 112 and dense surface 114 being manufactured separately and subsequently combined. In one embodiment, discussed below in reference to FIGS. 5 and 6A-F, porous piezoelectric material 110 is manufactured using an improved phase inversion method that integrally forms porous interior 112 and dense surface 114 from the same material. In an embodiment, this manufacturing method includes precisely controlling the size of pores in porous interior 112 to further improve the sensing performance of porous piezoelectric material 110.

In scenario 100, porous piezoelectric material 110 is implemented in a piezoelectric device 120 that includes porous piezoelectric material 110, electrodes 132 and 134, electrical connections 142 and 144, and a power-consuming element 160. Porous piezoelectric material 110 is deposited on electrode 132 with dense surface 114 facing away from electrode 132. Electrode 134 is deposited on dense surface 114. Without departing from the scope hereof, the shape of porous piezoelectric material 110 may be different from that shown in FIG. 1 (for example non-planar), and dense surface 114 may by any surface of porous piezoelectric material 110 which is away from electrode 132, such that electrode 134 may be in contact with dense surface 114 and not electrode 132. In one such example, dense surface 114 is away from electrode 132 without facing away from electrode 132, e.g., piezoelectric material 110 is approximately U-shaped with one end of the "U" disposed on electrode 132 and the other end of the "U" being associated with dense surface 114. Electrical connections 142 and 144 respectively connect electrodes 132 and 134 to power-consuming element 160. A force 150 applies a mechanical stress to piezoelectric device 120. Due to the piezoelectric effect, this mechanical stress produces a voltage between electrodes 132 and 134, and an electrical current runs through power-consuming element 160 via electrical connections 142 and 144.

In FIG. 1, power-consuming element 160 is a light emitting diode (LED). However, power-consuming element 160 may be any device capable of using or storing electrical energy. Additionally, power-consuming element 160 may be replaced by a measurement module that measures an electrical property of porous piezoelectric material 110 through electrical connections 142 and 144 and electrodes 132 and 134, without departing from the scope hereof. In one example, such a measurement module is configured to measure a voltage between electrodes 132 and 134, or electrical charges collected on electrodes 132 and 134, in response to force 150, such that piezoelectric device 120 functions as a pressure/stress sensor. Also without departing from the scope hereof, power-consuming element 160 may be replaced by a power supply that applies a voltage difference to electrodes 132 and 134 to change a dimensional property of porous piezoelectric material 110.

Optionally, piezoelectric device 120 is coupled to a mechanical fixture 170. For example, mechanical fixture 170 cooperates with force 150 to apply mechanical stress to porous piezoelectric material 110. Mechanical fixture 170 may have shape different from what is shown in FIG. 1 and be connected to one or more different portions of piezoelectric device 120. Although shown in FIG. 1 as being applied directly to electrode 134, force 150 may be applied differently. For example, force 150 may be applied to mechanical fixture 170 as a bending action that imposes a mechanical stress on piezoelectric materials 110.

In an embodiment, porous piezoelectric material 110 is flexible. In this embodiment, electrode 132, electrode 134, and, if included, mechanical fixture 170 may be flexible. For example, mechanical fixture 170 and piezoelectric device 120 bend in response to force 150 or a voltage applied to electrodes 132 and 134, in this embodiment.

Figure 2:
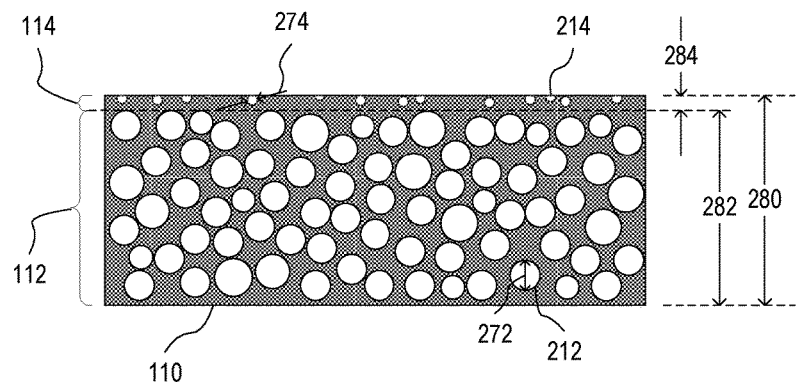
FIG. 2 illustrates the porous piezoelectric material of FIG. 1 in more detail, according to an embodiment.

FIG. 2 illustrates porous piezoelectric material 110 in more detail. FIG. 2 shows porous piezoelectric material 110 in the same cross-sectional sideview as used in FIG. 1. Piezoelectric material has extent 280 in a depth-wise dimension. In the same depth-wise dimension, porous interior 112 has extent 282 and dense surface 114 has extent 284. Extent 284 is, for example, in the range 0.5 to 2 micron. Extent 282 is, for example, greater than 30 micron, around 100 micron, on order hundreds of microns, or on order one or more millimeters. Extent 280 is equal to the sum of extents 282 and 284. In one embodiment, extent 282 is determined by the material volume used in film casting of porous piezoelectric material 110.

Porous interior 112 has pores 212. For clarity of illustration, not all pores 212 are labeled in FIG. 2. Pores 212 may have a range of sizes 272, and pores 212 of a variety of sizes 272 may coexist in porous interior 112. Size 272 is, for example, in the range 1-20 micron or in the range 2-10 micron. Porous interior 112 may have porosity greater than 40 percent, such as around 60 percent. In an embodiment, the range of sizes 272 is minimized to optimize mechanical and/or electrical properties of porous piezoelectric material 110. Likewise, size 272 and/or the porosity of porous interior 112 may be optimized to optimize mechanical and/or electrical properties of porous piezoelectric material 110.

Dense surface 114 has density greater than the density of porous interior 112, and dense surface 114 has porosity less than the porosity of porous interior 112. Optionally, dense surface 114 includes pores 214. For clarity of illustration, not all pores 214 are labeled in FIG. 2. Pores 214 may have a range of sizes 274, and pores 214 of a variety of sizes 274 may coexist in dense surface 114. Size 274 is, for example, less than one micron or less than four micron. In an embodiment, for the majority of pores 214, size 274 is less than size 272 for the majority of pores 212. Although, for clarity of illustration, extent 284 is shown as being larger than size 274, extent 284 may be similar to size 274 for at least some of pores 214, without departing from the scope hereof. Extent 284 may be non-uniform without departing from the scope hereof.

Pores 212 and 214 may have shapes different from those shown in FIG. 2, without departing from the scope hereof.

In an embodiment, porous interior 112 is substantially composed of (a) the same material that forms dense surface 114 and (b) pores 212. Porous piezoelectric material 110 is, for example, a film, a polymer, or a ceramic. Herein, "polymer" may refer to a polymer derived from a single monomer species, or a copolymer derived from a plurality of different monomer species. In an embodiment, porous piezoelectric material 110 is a polymer film substantially composed of a polymer and pores 212, and optionally pores 214. The polymer is, for example, polyvinylidene fluoride (PVDF), a derivative of PVDF, and/or polyvinylidenedifluoride-trifluoroethylene (PVDF-TrFE).

Figure 3:
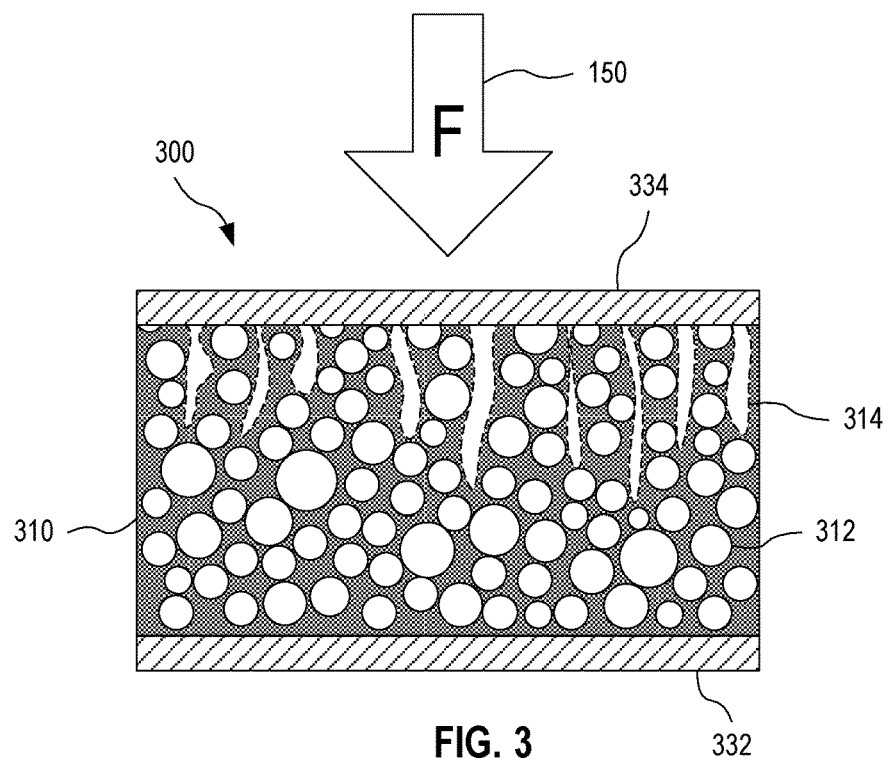
FIG. 3 illustrates a prior art piezoelectric material coupled with two electrodes to form a prior art piezoelectric device.

FIG. 3 illustrates a prior art piezoelectric material 310 coupled with electrodes 332 and 334 to form a prior art piezoelectric device 300. Piezoelectric material 310 is a porous film with pores 312. Piezoelectric material 310 is formed on electrode 332, and electrode 334 is deposited on the surface of piezoelectric material 310 facing away from electrode 332. Piezoelectric material 310 is likely to have fingerlike cavities 314 penetrating into piezoelectric material 310 from the surface associated with electrode 334. For clarity of illustration, not all pores 312 and fingerlike cavities 314 are labeled in FIG. 3.

Piezoelectric material 310 does not have a dense surface, such as dense surface 114 (FIG. 1), at the interface with electrode 334. At this interface, piezoelectric material 310 has pores 312 and likely also fingerlike cavities 314. Therefore, when force 150 applies mechanical stress to piezoelectric material 310, the contact area between piezoelectric material 310 and electrode 334 varies as a function of the properties of force 150. Such properties include, for example, the magnitude of force 150, the direction of force 150, and the shape and location of the contact area between piezoelectric material 310 and electrode 334 in relation to pores 312 and fingerlike cavities 314. Additionally, when depositing electrode 334 on piezoelectric material 310, electrode material may be deposited in pores 312 and fingerlike cavities 314 accessible from the surface of piezoelectric material facing away from electrode 332. Electrically conducting material inside fingerlike cavities 314 may produce an electrical short between electrodes 332 and 334, thus rendering prior art piezoelectric device 300 unusable.

Referring again to FIG. 1, dense surface 114 of porous piezoelectric material 110 eliminates, or at least reduces, variation in the contact area between porous piezoelectric material 110 and electrode 134 as a function of properties of force 150. Dense surface 114 also eliminates, or at least reduces, deposition of electrically conducting material in porous interior 112, thereby eliminating or reducing risk of an electrical short between electrodes 132 and 134. Accordingly, porous piezoelectric material 110, through dense surface 114, has properties superior to those of prior art piezoelectric material 310 (FIG. 3).

In general, the piezoelectric charge Q, collected by an electrode in contact with a surface A of a piezoelectric material subject to a mechanical stress T, may be expressed as a surface integral over surface A of the local electric charge density displacement $D_i$:

$$Q = \oint_A D_i dA. \quad \text{(Eq. 1)}$$

$D_i$ is the electric charge density associated with the i'th surface element of surface A. $D_i$ is given by $$D_i = \frac{\mu_i}{V}. \quad \text{(Eq. 2)}$$

$\mu_i$ is the dipole moment induced by mechanical stress T and associated with the i'th surface element of surface A. V is the volume of the piezoelectric material. Because surface A is greater for a dense surface than a porous surface, eq. 1 shows that a dense surface will collect more charges than a porous surface of equivalent overall size. Porous piezoelectric material 110 (FIG. 1) includes dense surface 114. Hence, the piezoelectric charge collected by electrode 134, when porous piezoelectric material 110 is subject to force 150, exceeds the piezoelectric charge collected by electrode 334 from an embodiment of prior art piezoelectric material 310 subject to force 150 and having dipole moment and volume similar to those of porous piezoelectric material 110.

The piezoelectric charge coefficient $d_{ij}$ is the polarization generated per unit of mechanical stress T. $d_{ij}$ may be defined as $$d_{ij} = \frac{\partial D_i}{\partial T_j}. \quad \text{(Eq. 3)}$$

As a result, the piezoelectric charge Q (see eq. 1), associated with a given mechanical stress T, is proportional to the piezoelectric charge coefficient $d_{ij}$. According to eqs. 2 and 3, the piezoelectric charge coefficient $d_{ij}$ may be rewritten as $$d_{ij} = \frac{\partial}{\partial T_j}\left(\frac{\mu_i}{V}\right) = \frac{1}{V}\left(\frac{\partial \mu_i}{\partial T_j}\right) - \frac{\mu_i}{V^2}\left(\frac{\partial V}{\partial T_j}\right). \quad \text{(Eq. 4)}$$

The compressibility β of the piezoelectric material is defined as $$\beta = \frac{1}{V}\left(\frac{\partial V}{\partial T_j}\right). \quad \text{(Eq. 5)}$$

It follows from eqs. 4 and 5 that the piezoelectric charge coefficient $d_{ij}$ is proportional to the compressibility β. Consequently, the piezoelectric charge Q associated with a given mechanical stress T, is proportional to the compressibility β. Porous interior 112 of porous piezoelectric material 110 (FIG. 1) is highly compressible and, when subject to force 150, produces a greater piezoelectric charge Q than a similar non-porous material.

Figure 4:
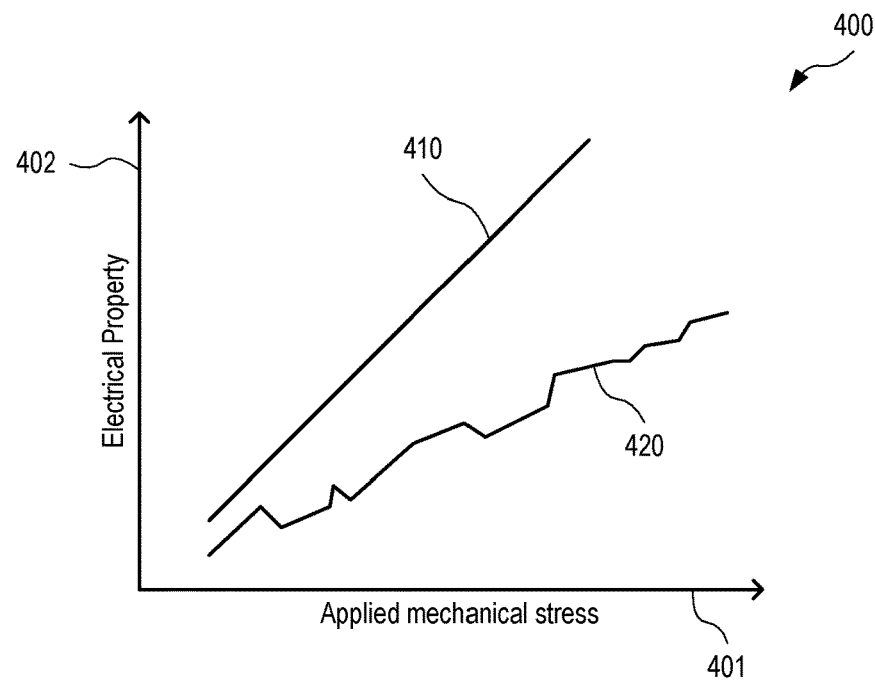
FIG. 4 shows (a) piezoelectric output of the piezoelectric device of FIG. 1, according to an embodiment and (b) piezoelectric output of the prior art piezoelectric device of FIG. 3, wherein the prior art piezoelectric device is based upon a prior art piezoelectric material of similar size and material composition as the porous piezoelectric material of FIG. 1 but lacks the dense surface.

FIG. 4 shows an exemplary piezoelectric output 410 of piezoelectric device 120 (FIG. 1) together with an exemplary piezoelectric output 420 of a prior art piezoelectric device 300 (FIG. 3), wherein prior art piezoelectric device 300 is based upon prior art piezoelectric material 310 of similar size and material composition as porous piezoelectric material 110 but lacks dense surface 114. FIG. 4 plots piezoelectric outputs 410 and 420 as electrical property 402 versus applied mechanical stress 401. Electrical property 402 is, for example, electrical charge collected by electrodes 132 (332) and 134 (334), electrical current between electrodes 132 (332) and 134 (334), or a voltage between electrodes 132 (332) and 134 (334). Applied mechanical stress 401 indicates, for example, pressure or force.

Piezoelectric output 410 exceeds piezoelectric output 420 because of the superior piezoelectric charge collection efficiency at dense surface 114, as compared to the porous surface of prior art piezoelectric material 310 associated with the interface with electrode 334. Piezoelectric output 420 may be also be negatively impacted by sub-optimal poling of piezoelectric domains in prior art piezoelectric material 310 due to deposition of electrically conducting material in pores 312/fingerlike cavities 314. Such deposition produces a non-planar electrode, which in turn results in local variation in the poling direction.

Piezoelectric output 410 has higher linearity than piezoelectric output 420. Piezoelectric output 410 exhibits a relatively constant slope while piezoelectric output 420 has numerous slope changes. These slope changes may stem from (a) mechanical stress-dependent contact area between prior art piezoelectric material 310 and electrode 334 and/or (b) variable behavior due to deposition of electrically conducting material in pores 312/fingerlike cavities 314, both of which arise from the porous surface of prior art piezoelectric material 310 at the interface with electrode 334. Accordingly, porous piezoelectric material 110 (FIG. 1) achieves the benefits of porosity, through porous interior 112, while also maximizing the piezoelectric charge collection properties using dense surface 114.

In an embodiment of piezoelectric device 120, dense surface 114 includes pores 214 (FIG. 2) which may produce (a) noise in the piezoelectric output 410 and/or (b) a reduced piezoelectric output 410 as compared to the piezoelectric output of embodiments of piezoelectric device 120 wherein dense surface 114 does not have pores 214. However, in certain embodiments, pores 214 have density and size 274 (FIG. 2) to ensure a consistent electrical contact between dense surface 114 and electrode 134 to produce a piezoelectric output 410 that is less noisy and/or greater than piezoelectric output 420. In an embodiment, electrode 134 is in substantially spatially uniform contact with dense surface 114 such that contact between electrode 134 and dense surface 114 is substantially independent of dynamic dimensional variation of porous piezoelectric material 110.

Figure 5:
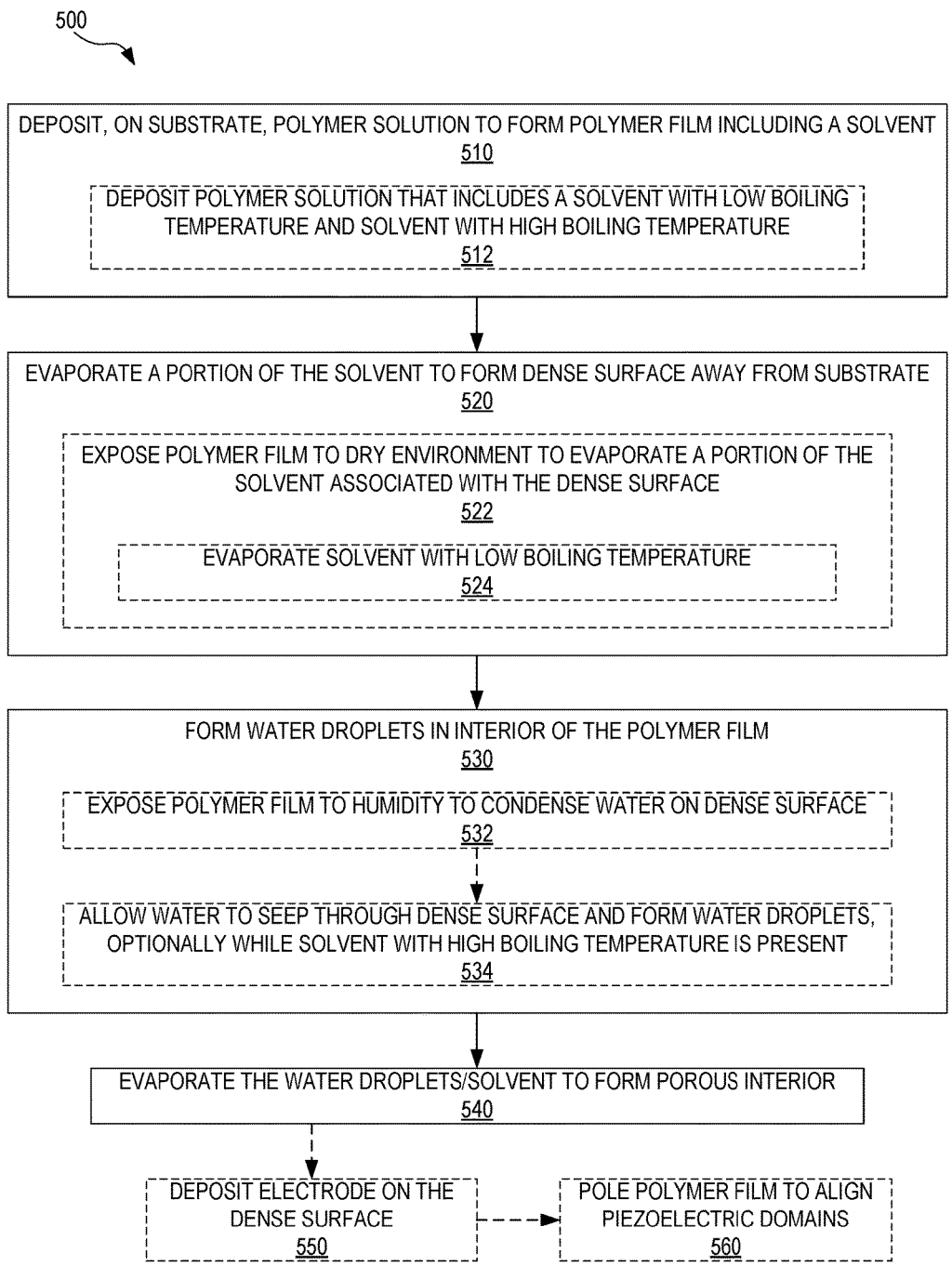
FIG. 5 illustrates a method manufacturing a porous piezoelectric polymer film with a dense surface, according to an embodiment.

FIG. 5 illustrates one exemplary method 500 for manufacturing a porous piezoelectric polymer film with a dense surface. Method 500 allows for versatile control of the surface state of the polymer film. Method 500 may be used to manufacture an embodiment of porous piezoelectric material 110 (FIG. 1). FIGS. 6A-F schematically illustrate steps of method 500, according to one example. FIGS. 5 and 6A-F are best viewed together.

Figure 6A:
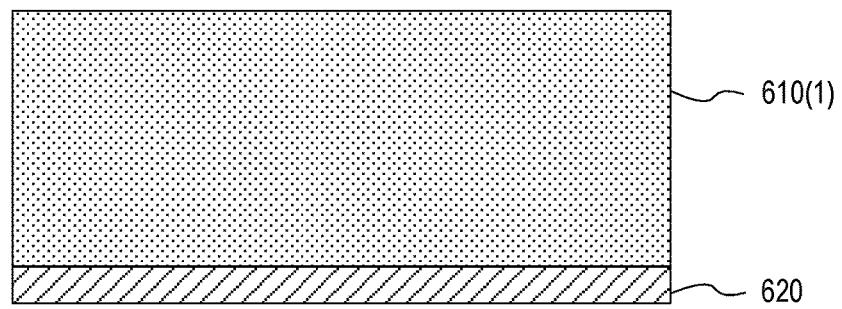
FIGS. 6A-F schematically illustrate steps of the method of FIG. 5.

In a step 510, a polymer solution, such as a PVDF solution, is deposited on a substrate 620 in the form of a polymer film 610(1), as shown in FIG. 6A. Polymer film 610(1) includes a solvent. Substrate 620 is, for example, an electrode such as electrode 132. Substrate 620 may be planar and/or non-planar. In one example, at least a portion of substrate 620 is curved. Step 510 may utilize a deposition method known in the art including, but not limited to, casting, dip coating, spin coating, spray coating, thermal spray coating, drop coating, painting, and a combination thereof.

Figure 6B:
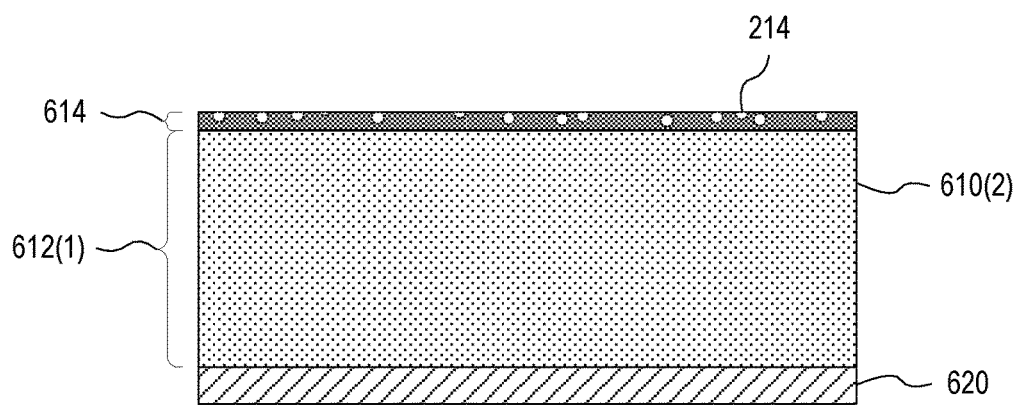

In a step 520, a portion of the solvent, included in polymer film 610(1), is evaporated to form a polymer film 610(2) having a dense surface 614 facing away from substrate 620, as depicted in FIG. 6B. Dense surface 614 is an embodiment of dense surface 114 (FIG. 1) and may include pores 214 (FIG. 2). In one embodiment, step 520 includes a step 522 of exposing polymer film 610(1) to a dry environment to evaporate a portion of the solvent located in a portion of polymer film 610(1) associated with dense surface 614. Optionally, step 520 includes exposing polymer film 610(1) to an elevated temperature to facilitate evaporation of a portion of the solvent located in a portion of polymer film 610(1) associated with dense surface 614, either in cooperation with step 522 or alone. Although, for clarity of illustration, pores 214 are shown as being smaller than the depth (equivalent to extent 284 in FIG. 2) of dense surface 614, at least some of pores 214 may span the full depth of dense surface 614, without departing from the scope hereof.

Figure 6C:
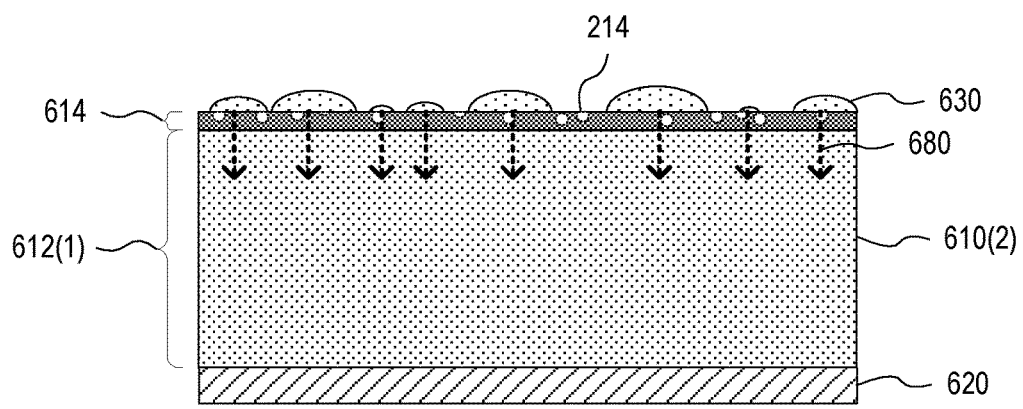
Figure 6D:
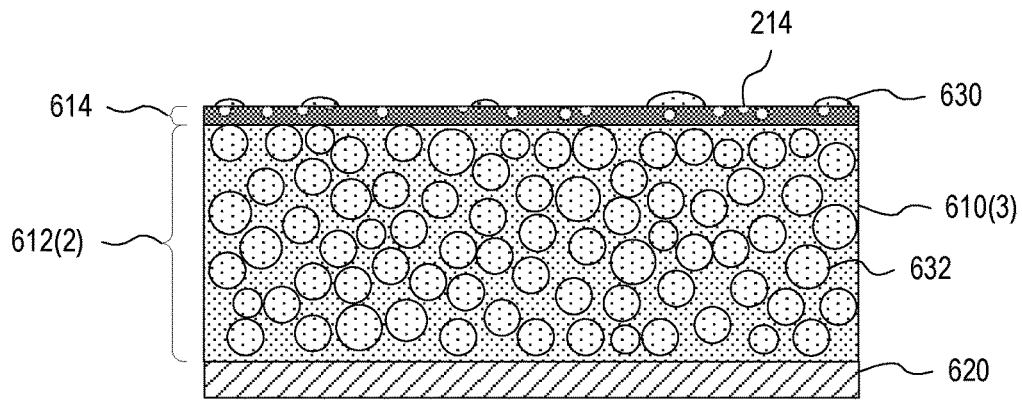

In a step 530, water droplets are formed in the interior 612(1) of polymer film 610(2) to form a polymer film 610(3) with an interior 612(2) that includes water droplets 632, see FIG. 6D. In one embodiment, step 530 includes steps 532 and 534.

In step 532, polymer film 610(1) is exposed to humidity to condense water 630 on dense surface 614, as shown in FIG. 6C. In one example of step 532, volatile solvent in polymer film 610(1) begins to evaporate, which cools the surface of polymer film 610(1) facing away from substrate 620. In the humid environment, this surface cooling leads to condensation of water 630 on polymer film 610(1).

In step 534, condensed water 630 is allowed to seep through dense surface 614 to interior 612(1), as indicated by arrows 680 in FIG. 6C, to form water droplets 632 (see FIG. 6D). Thus, step 534 modifies polymer film 610(2) to form a polymer film 610(3) having an interior 612(2) with embedded water droplets 632. In one example of step 534, gravity drives (a) migration of condensed water 630 into interior 612(1) and (b) dispersion of condensed water 630 throughout at least a portion of interior 612(1). In this example, at least a portion of the solvent of polymer film 610(2) has lower density than water. In a specific case, the solvent includes Tetrahydrofuran-Dimethylformamide (THF-DMF). THF has density 889 kg/m$^3$ and DMF has density 944 kg/m$^3$. Both of these densities are lower than the 1000 kg/m$^3$ density of water. In another example of step 534, polymer film 610(2) includes a hydrophilic solvent that promotes the migration and dispersion processes. In yet another example of step 534, hydrophilic solvent properties and solvent with density less than water cooperate to drive the migration and dispersion processes. In an embodiment of step 534, water droplets 632 are formed through phase inversion. In this example, there is a diffusive interchange between solvent and non-solvent in polymer film 610(2), which leads to a phase separation between a polymer-rich phase and a polymer-poor phase. The polymer-poor phase forms water droplets 632. Water droplets 632 may include a portion of the solvent included in polymer film 610(2).

Steps 532 and 534 may be performed sequentially, as indicated in FIG. 5, in parallel, or with a partial temporal overlap, without departing from the scope hereof. Method 500 may achieve step 534 by letting polymer film 610(3) sit for a duration sufficient for at least a portion of condensed water 630 to seep through dense surface 614. Condensed water 630, or a portion thereof, may penetrate dense surface 614 through pores 214. Formation of water droplets 632 may take place through phase inversion.

Figure 6E:
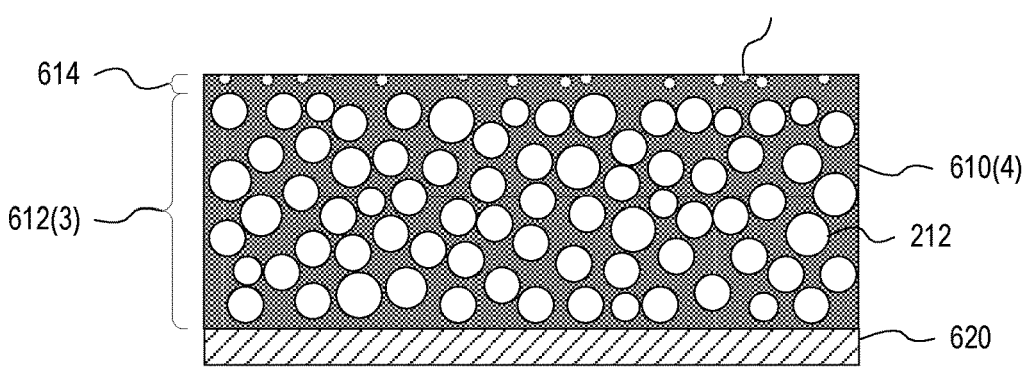

In a step 540, water droplets 632 and remaining solvent are evaporated to form pores 212 (FIG. 2), as illustrated in FIG. 6E. Step 540 thereby modifies polymer film 640(3) to produce polymer film 610(4) that includes porous interior 612(3). Porous interior 612(3) is a polymer scaffold with pores 212, and porous interior 612(3) is an embodiment of porous interior 112 (FIG. 1). Step 540 may include exposing polymer film 610(3) to a dry environment and/or elevated temperature. In an embodiment, step 540 further includes evaporating at least a portion of any remaining solvent in polymer film 610(3).

In certain embodiments, steps 530 and 540 temporally overlap. In one such example, step 530 includes evaporation of solvent from polymer film 610(2). Such solvent evaporation may take place at the same time as condensation of water 630. Under certain conditions, solvent evaporation cools the surface of polymer film 610(2), which promotes condensation of water 630 on polymer film 610(2). As the temperature of the polymer film increases, solvent and water droplets 632 begin to evaporate.

Steps 530 and 540 cooperate to form pores 212. The water/humidity exposure in step 530 is critical to the formation of pores 212. In contrast, the dry environment associated with step 520 prevents the formation of larger water droplets, such that dense surface 614 is less porous than porous interior 612(3), and optional pores 214 are generally smaller than pores 212.

Figure 6F:
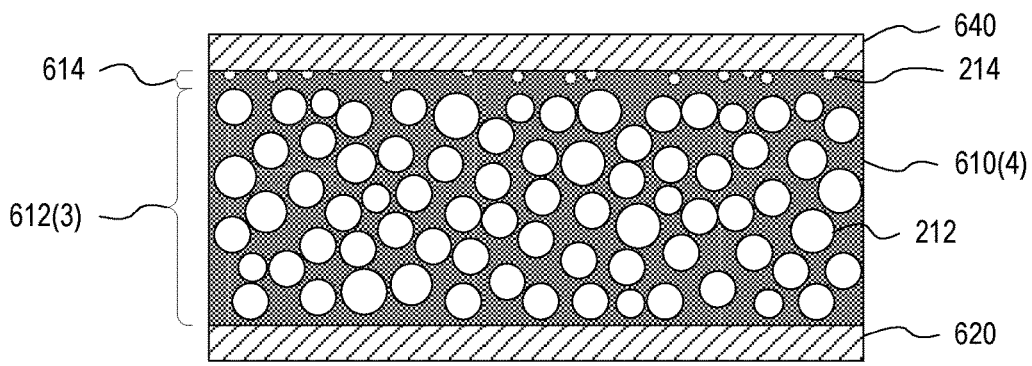

In an optional step 550, an electrode 640 is deposited on dense surface 614, see FIG. 6F. Electrode 640 may cover all of dense surface 614 or a portion thereof. In one example of step 550, electrode 640 is deposited on dense surface 614 using a method known in the art, such as electron beam deposition, vapor deposition, filtered arc deposition, or a combination thereof.

In one embodiment, method 500 includes a step 560 subsequent to step 550. In step 560, polymer film 610(4) is poled to align piezoelectric domains in polymer film 610(4). In one example of step 560, a voltage is applied to electrode 640 and an embodiment of substrate 620 that is an electrode. This voltage bias at least partially aligns piezoelectric domains of polymer film 610(4) to improve piezoelectric properties of polymer film 610(4).

Solvent(s) included in polymer film 610(1) may be selected to optimize the processes associated with steps 510, 520, 530, and/or 540. Certain embodiments of method 500 utilize two solvents, wherein one of the two solvents has a lower boiling temperature than the other one of the two solvents. These solvents facilitate the separate evaporation processes of steps 520 and 540. In such embodiments, (a) step 510 includes a step 512, (b) step 520 includes steps 522 and 524, (c) step 530 is performed while the solvent with higher boiling temperature is present in polymer film 610(3), and (d) step 540 includes evaporating at least a portion of the solvent with higher boiling temperature.

Step 512 includes depositing, onto substrate 620, a polymer solution to form a polymer film 610(1) that includes a solvent with a lower boiling temperature and a solvent with a higher boiling temperature. Step 512 may utilize the deposition methods discussed in connection with step 510. Step 524 includes evaporating the solvent with lower boiling temperature to form dense surface 614. Due to its lower boiling temperature, this solvent evaporates relatively fast, which results in the formation of dense surface 614. After evaporation of the solvent with lower boiling temperature, polymer film 610(2) still includes at least a portion of the solvent with a higher boiling temperature such that water droplets 632 may be formed though phase inversion in step 530.

In an embodiment, the concentration of solvent(s) included in polymer film 610(1) is optimized to manufacture pores 212 of a desired size 272 and, optionally, a desired uniformity of size 272. In one example, the concentration of solvent(s) is such that size 272 of pores 212 is substantially uniform, e.g., the coefficient of variation of size 272 is less than 20%, less than 10%, or less than 5%. Such size uniformity may produce greater piezoelectric output and/or better linearity of the piezoelectric output.

EXAMPLE I

Porous PVDF-TrFE Film with Dense Surface

Example I discloses examples of porous piezoelectric material 110 (FIG. 1). These exemplary porous PVDF films are manufactured according to an embodiment of method 500 (FIG. 5). Example I describes the manufacture and performance properties of the porous PVDF film, as well as piezoelectric devices based thereupon. Such devices are examples of piezoelectric device 120 (FIG. 1). Herein, "PVDF film" refers to a film that is based upon PVDF. A "PVDF film" may include other agents and/or be a derivative of PVDF.

Introduction

Polyvinylidene fluoride (PVDF) is a piezoelectric polymer with unique features that include structural flexibility, ease of processing, and chemical resistance. Wearable devices powered by such flexible transducers and harvesters are making great strides, with a focus on portable and flexible materials for biomedical sensing and power sources seamlessly integrated with the human body. The biocompatibility, high piezoelectric power density, and high flexibility of PVDF are desirable attributes for these applications. Moreover, the mass density and processing costs of piezoelectric polymers, such as PVDF, are relatively low per unit volume.

In the prior art, additive modeling and phase separation have been used to prepare porous PVDF films on large scale substrates. Both of these prior art methods have drawbacks. For the additive method, metal salt and nanometer particles cannot be removed completely, and the remainder in the film interferes with poling procedures. Moreover, pore size varies and large through-holes (e.g., fingerlike cavities 314, FIG. 3) exist in the films. In prior art phase separation methods, when liquid-liquid demixing precedes crystallization, various cellular structures result whose pores, either sponge-like (e.g., pores 312, FIG. 3) or fingerlike (e.g., fingerlike cavities 314), are formed from growth of the polymer-poor phase within the matrix of the polymer-rich phase. Example I investigates PVDF phase separation because it gives porous morphology with variable pore size and three dimensional structures. Also, PVDF films may be mounted on different substrates with structural flexibility and ease of processing. However, prior art PVDF porous films are mostly used as passive materials in tissue engineering, separation membranes, mechanical damping, and packaging. Their potential as a soft active material for electromechanical transducers appears to have been neglected.

Prior to this disclosure, two main obstacles have hindered the use of porous PVDF films in piezoelectric applications. First, most prior art PVDF films obtained by immersion precipitation have non-uniform structure at and underneath the surface, similar to the illustration shown in FIG. 3. Finger-like cavities, such as fingerlike cavities 314, may be acceptable for filtering applications but will negatively impact the performance of a sensor, both in terms of sensitivity and in terms of precision. Second, the film's top surface comprises many defects and pinholes, possibly leading to short circuit between electrodes.

Example I describes facile manufacture of porous PVDF films that overcome these two obstacles. The manufacturing method utilizes phase inversion and is an example of method 500 (FIG. 5) based upon certain polymer and solvent compositions. The resulting porous PVDF films have a dense surface and are examples of porous piezoelectric material 110 (FIG. 1). Example I further demonstrates that such porous PVDF films may form the basis of a high-efficiency piezoelectric device. Each of the porous PVDF films has an asymmetric porous structure, including a porous interior (an example of porous interior 112) and a dense surface (an example of dense surface 114). This asymmetric structure promotes larger piezoelectric charge collecting area and uniformly aligned poling direction. Direct film deposition and pore-formation on an electrode surface, as discussed in reference to FIG. 5, make this technology suitable for a wide range of piezoelectric devices 120 (FIG. 1). Example I identifies membrane crystalline characters using wide angle X-ray diffraction (XRD) and differential scanning calorimetry (DSC) analysis. Both simulation data and test data confirm that porous structure can enhance piezoelectric power output and other piezoelectric performance characteristics.

Film Manufacturing Details

Example I utilizes an embodiment of method 500 (FIG. 5). In the embodiment of step 510 specific to Example I, the polymer solution that forms polymer film 610(1) is produced by dissolving 0.48 grams of Polyvinyledenedifluoride-Trifluoroethylene (PVDF-TrFE) in 5 milliliters Tetrahydrofuran-Dimethylformamide (THF-DMF) under magnetic stirring to form a transparent solution. The volume ratio of THF to DMF is 1:2, and the PVDF to TrFE molar ratio is 75:25. These ratios may deviate somewhat from the stated numbers without departing from the scope hereof. The polymer solution is deposited onto an electrode (an example of substrate 620) using casting and dip coating for planar and curved electrodes, respectively. In the case of casting, a casting knife is fixed perpendicular to the substrate, and the distance from the knife edge to the substrate is 100 micron. One microliter of polymer solution is cast on the substrate. Example I may utilize other deposition methods without departing from the scope hereof.

In the embodiment of step 520 specific to Example I, polymer film 610(1) is evaporated in a dry nitrogen environment for 8 minutes. Other durations, such as durations in the range between 5 and 15 minutes may be used without departing from the scope hereof. Likewise, other types of dry environment may be utilized, for example argon. During evaporation in the dry nitrogen environment, mainly THF evaporates from the surface of polymer film 610(1). This leads to a high polymer concentration at the surface and solidification of the polymer in the top layer, resulting in the formation of polymer film 610(2) having dense surface 614.

In the embodiment of step 530 specific to Example I, polymer film 610(2) is placed in a humidity chamber, having relative humidity of approximately 80% and temperature of approximately 25° C., for about 6 hours to allow for complete phase separation between solvent and non-solvent (e.g., water), thus producing polymer film 610(3).

In the embodiment of step 540 specific to Example I, polymer film 610(3) is simultaneously dried and annealed at approximately 120° C. for about 60 minutes to ensure complete evaporation of the solvent. This forms polymer film 610(4).

In the embodiment of step 550 specific to Example I, a 200 nanometer thick copper electrode is deposited on polymer film 610(4) to form electrode 640.

In the embodiment of step 560 specific to Example I, the electrical poling process over polymer film 610(4) is performed by applying a 75 Volt/micron electrical field between the two electrodes for about 30 minutes at 90° C. and during subsequent cooling of the polymer film to room temperature.

The final thickness of polymer film 610(4) was measured using a surface profilometer (Dektak 6M) and found to be around 80 micron.

Data, Analysis, and Discussion

In prior art phase separation methods, when PVDF porous film is prepared with Tetrahydrofuran-Dimethylformamide (THF-DMF) solvent in a humid environment, larger pores than those on the top surface are coexistent with smaller pores in the inner film. Larger pores originate from the coalescence of water droplets and small pores from the depletion by mixing of water droplets with the solution. However, as discussed above, a dense surface and uniform structure are desired in piezoelectric device applications. Therefore, the pre-evaporation procedure of step 520 of method 500 (FIG. 5), is introduced to eliminate formation of large pores on the surface.

Most prior art phase separation procedures are carried out by immersing the polymer solution into non-solvent bath to induce porous structure. The prior-art film structure is formed immediately after submersion in the non-solvent bath. Such intensive phase separation induces finger-like cavities and large open cells within the film, as shown in FIG. 3. In the manufacturing method of Example I, precisely controlled phase inversion of a PVDF polymer solution, including THF-DMF solvent, in a humid environment induces uniform cavity formation in the film structure. The volume of water penetrating the surface into the inner structure is much smaller and slower-moving than in prior art phase separation. The THF-DMF mixed solvent allows a minority presence of a non-solvent (water) to induce phase separation, as discussed in reference to step 530 of method 500. Additionally, by varying solvent ratio and humidity exposure, different pore morphologies may be achieved.

Figure 7:
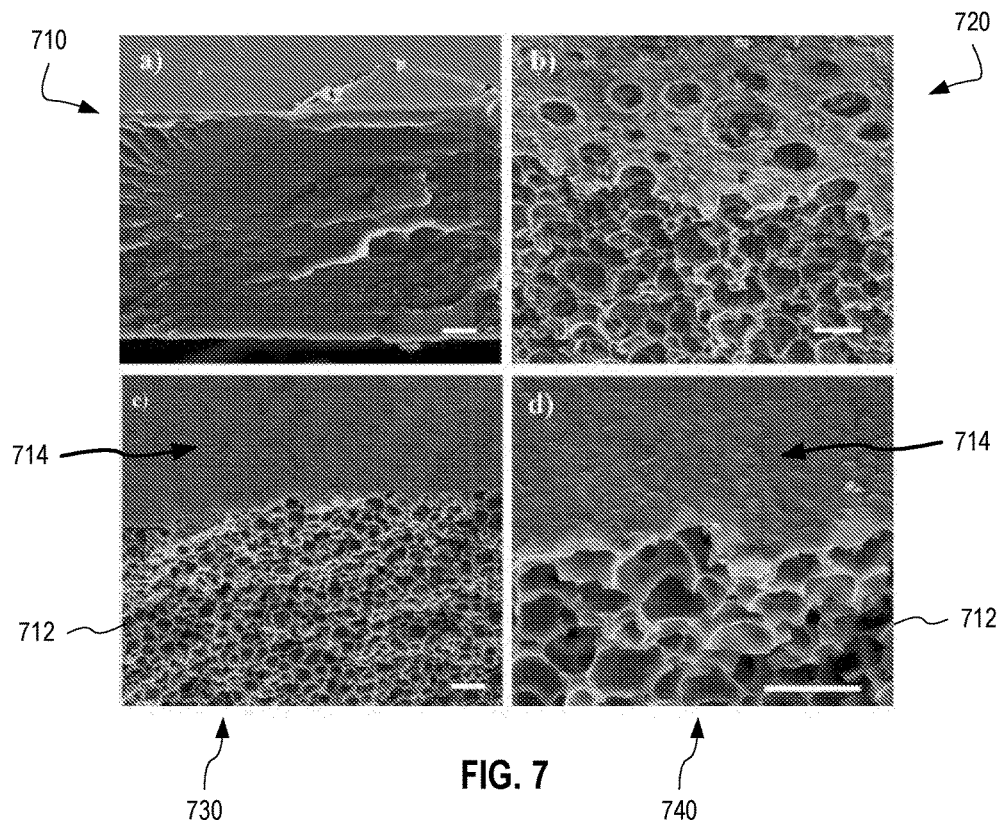
FIG. 7 shows scanning electron microscopy images of top surfaces and cross sections of Polyvinyledenedifluoride-Trifluoroethylene (PVDF-TrFE) films prepared according to an embodiment of the method of FIG. 5, and prepared according to prior art methods.

FIG. 7 shows scanning electron microscopy (SEM) images 710, 720, 730, and 740 of top surfaces and cross sections of Polyvinyledenedifluoride-Trifluoroethylene (PVDF-TrFE) films prepared according to prior art methods and according to the method of Example I. In each of SEM images 710, 720, 730, and 740, the white scale bar is 10 microns long.

SEM image 710 shows a PVDF-TrFE film prepared according to a prior art method using pure THF as solvent. This prior art film has a smooth top surface and the inner structure is solid.

SEM image 720 shows a prior art three-dimensional porous PVDF-TrFE film prepared at room temperature according to a prior art method using THF-DMF mixed solvent. This film was obtained by dip coating in a humid environment and does not have a dense surface. When a solvent combining DMF and THF is used, solvent evaporation is slowed down, making it possible for the water droplets to sink into the film to ultimately form a porous interior. However, as water droplets condense on the surface during most of the formation process, the result, as evident in SEM image 720, is larger pores and an uneven porous top surface that includes large pores.

SEM image 730 shows a three-dimensional porous PVDF-TrFE film prepared according to the method of the present Example I. SEM image 740 is a closer view of film of SEM image 730. This film has a dense surface 714 and a porous interior 712. Dense surface 714 and porous interior 712 are examples of dense surface 614 and porous interior 612(3), such that the film of SEM images 730 and 740 is an example of polymer film 610(4). The film was prepared at room temperature using 16% weight concentration PVDF in THF-DMF mixed solvents in step 510. THF's boiling temperature is 66° C., which encourages fast formation of dense surface 714 when exposed to the dry environment in step 520. Porous interior 712 has pores with diameters of approximately 3 to 5 micron. These pores are examples of pores 212 (FIG. 2). SEM image 740 further shows that small holes (examples of pores 214, FIG. 2) remain in dense surface 714 as paths for condensed water 630 to seep through dense surface 714, as discussed in reference to step 534 of method 500.

Figure 8:
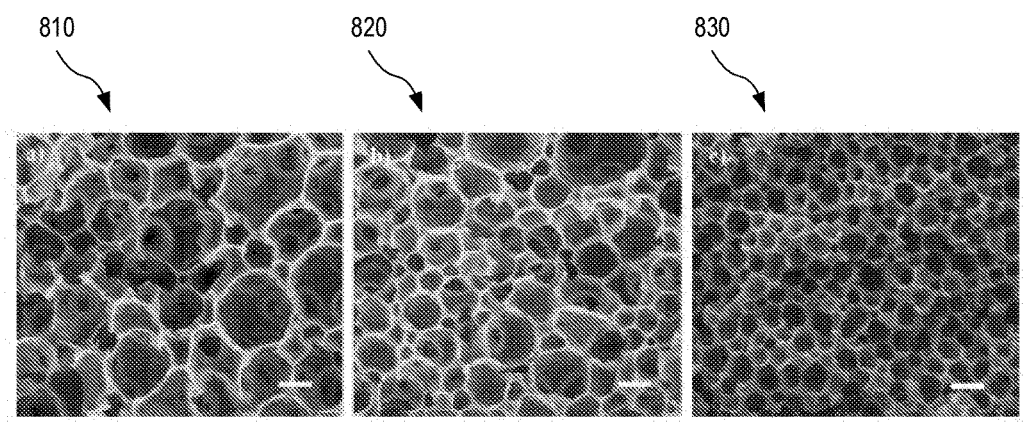
FIG. 8 shows cross-sectional scanning electron microscopy images of a porous PVDF-TrFE film having a dense surface, according to an embodiment.

FIG. 8 shows cross-sectional SEM images 810, 820, and 830 of a porous PVDF-TrFE film, having a dense surface, such as the film associated with SEM images 730 and 740 (FIG. 7). SEM images 810, 820, and 830 illustrate the effect of solvent concentration on dimensional stability of pores in the porous interior of the present PVDF-TrFE film. DMF solvent is hydrophilic and has relatively high moisture absorption. A large concentration of DMF solvent in the polymer solution imposes poor dimensional stability of pores, which negatively impacts the mechanical properties and, hence, practical applicability of the film. SEM images 810, 820, and 830 demonstrate that the present manufacturing method is capable of controlling dimensional properties of the pores within the film. The films of SEM images 810, 820, and 830 were prepared using 8%, 12%, and 16% weight concentrations, respectively, of PVDF in THF-DMF (in step 510). Increased polymer concentration hinders penetration of non-solvent during the phase separation step in step 530. In the lower PVDF concentration (SEM images 810 and 820), the pore diameter ranges from 4 to 12 microns. With 16% concentration (SEM image 830), the solution reaches a balance between non-solvent penetration and cavity formation. SEM image 830 shows uniform pore structure, wherein the pore diameter is stabilized around 4 microns. Uniform pore structure is desirable for piezoelectric performance.

The density of the solid PVDF films (e.g., the film of SEM image 710, FIG. 7) was measured as $\rho_d=1874$ kg/m$^3$. This value is reasonable, given that a PVDF-TrFE (70/30) film has a density of 1917 kg/m$^3$. The density of the porous films prepared from 16% solution (e.g., the film of SEM image 830) was determined to be $\rho_f=751$ kg/m$^3$. The lower density of the porous films suggest a highly porous structure with a porosity of $\varphi=60\%$. For the given solvent, non-solvent and copolymer, film porosity increased when polymer concentration was changed from 16% to 8% (FIG. 8). Porosity may also be varied by changing the type of solvent and/or non-solvent used in the phase separation process (e.g., step 530 of method 500). However, the choice of solvent and non-solvent also affects pore morphology which may strongly influence the electrical and mechanical properties of the resulting films.

For the porous PVDF film with dense surface (SEM images 730 and 740), the density was determined as $\rho_f=785$ kg/m$^3$, indicating that dense surface 714 does not add much weight to the film. Porous interior 712 exhibits a symmetrical sponge structure through the whole thickness under dense surface 714. Because of its weak solvent power, the minority presence of the non-solvent was sufficient to induce the phase inversion of the polymer solution. Therefore, liquid-liquid phase separation occurred at an early stage, and macro voids could not develop.

Figure 9:
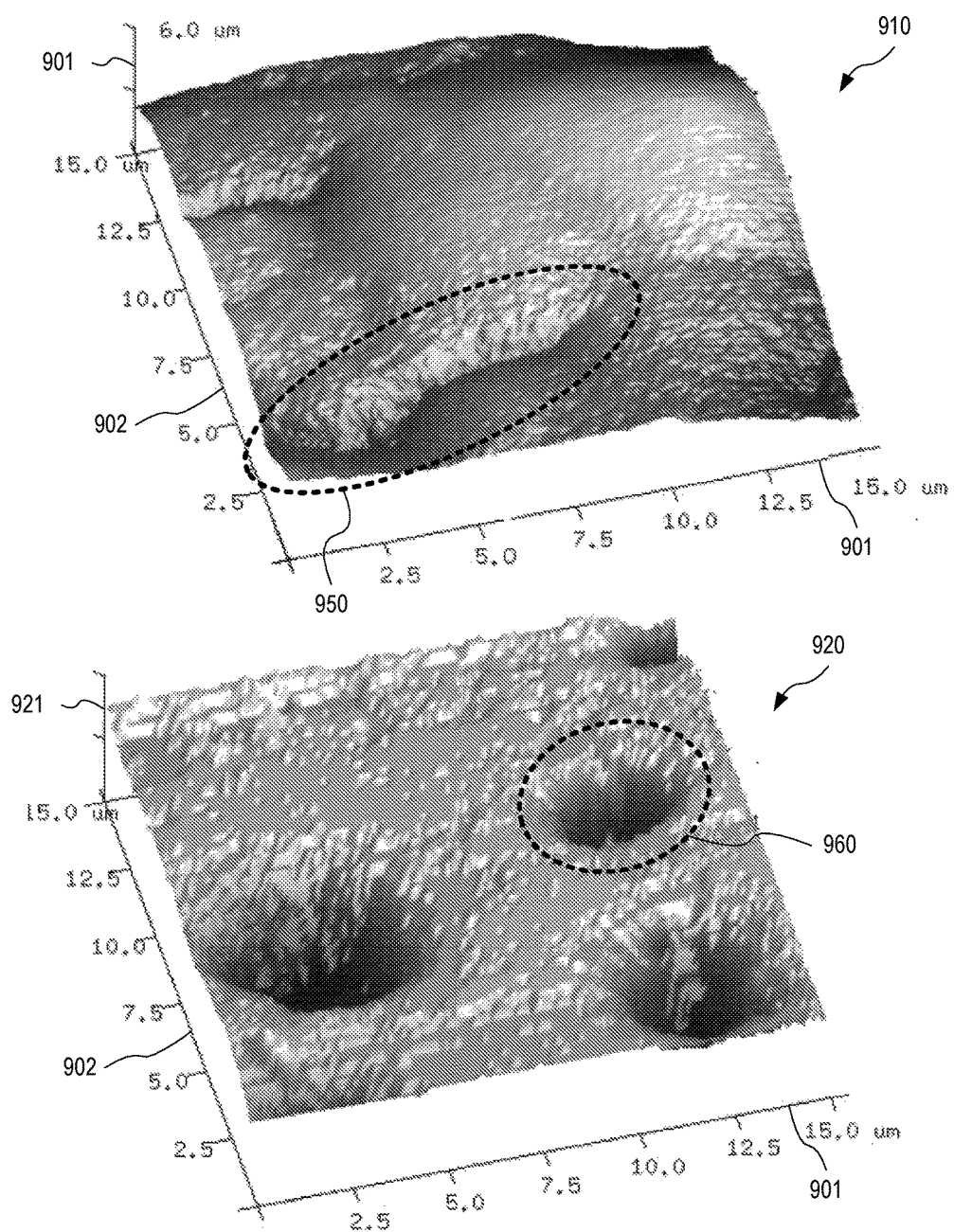
FIG. 9 shows a three-dimensional atomic force microscopy image of the topography of the dense surface of a porous PVDF film manufactured according to an embodiment of the method of FIG. 5, as well as Young's modulus of the dense surface.

FIG. 9 shows a three-dimensional atomic force microscopy (AFM) image 910 of the topography of the dense surface of a porous PVDF film manufactured according to the method of present Example I, as well as Young's modulus 920 of the dense surface. The porous PVDF film is similar to the film associated with SEM images 730 and 740 (FIG. 7).

Small cracks in the surface are observed from AFM image 910, in agreement with SEM image 740. Oval 950 indicates one such crack. Young's modulus 920 is obtained by the retract curve using the Derjaguin, Muller, Toropov (DMT) model (see Derjaguin et al., *Effect of contact deformations on the adhesion of particles*, Journal of Colloid and Interface Science, 1975, 53(2): pp. 541-557). The map reveals spots with obviously small Young's modulus indicating less support under the surface. Oval 960 indicates one such spot. Combined with SEM images 730 and 740, it can be inferred that the lack of support is related to subsurface pores (examples of pores 212). Moreover, these weak spots are never observed in AFM images from solid film. Considering the force applied on the AFM probe tip, lower mechanical energy is necessary to induce deformation to a porous film. This finding proves that the compressibility of a film can be tuned by the porous structure.

Figure 10:
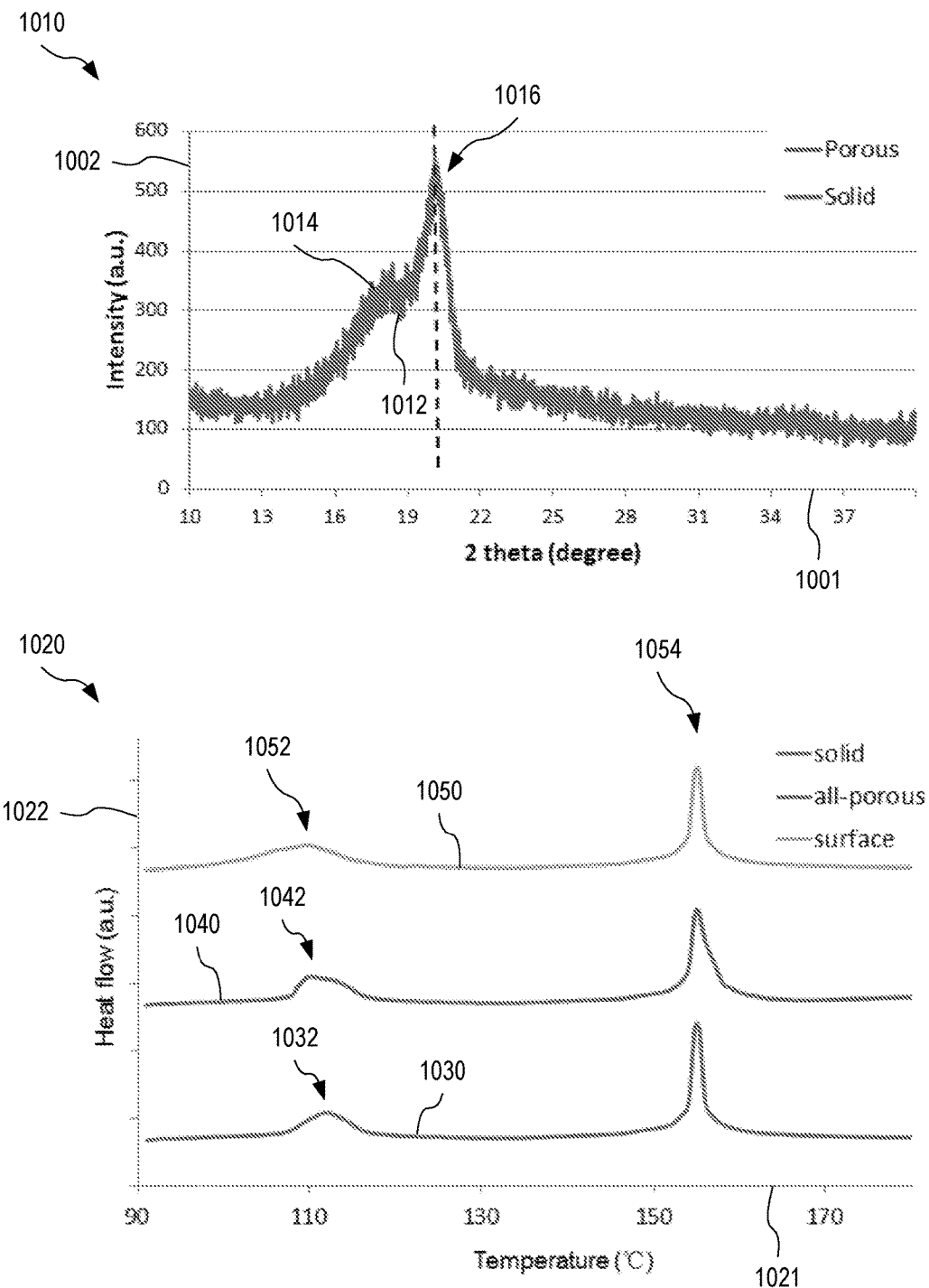
FIG. 10 shows x-ray diffraction data and differential scanning calorimetry data for exemplary PVDF-TrFE films of different structures.

PVDF-TrFE copolymer has a high piezoelectric coefficient. Copolymers like TrFE can create artificial defects to decrease the energy to crystallize into the all-trans form. PVDF-TrFE generally exhibits good piezoelectric behavior and a single all-trans polar crystalline phase ($\beta$-phase) that is stable in nanostructure without additional stretch processing. Hence, PVDF-TrFE is a good choice for the material of porous piezoelectric material 110 (FIG. 1). FIG. 10, discussed below, demonstrates that these desirable crystalline properties hold true also for the present porous PVDF-TrFE film with a dense surface.

FIG. 10 shows XRD data 1010 and DSC data 1020 for PVDF-TrFE films of different structures. XRD data 1010 includes (a) an XRD curve 1012 for a porous PVDF-TrFE film having a dense surface and manufactured according to the Example I embodiment of method 500, such as the PVDF-TrFE film associated with SEM images 730 and 740 (FIG. 7), and (b) an XRD curve 1014 for a solid PVDF-TrFE film such as the film associated with SEM image 710. XRD curves 1012 and 1014 are plotted as intensity 1002 versus diffraction angle (2θ) 1001. In the 10-40° range of diffraction angle 1001, a sharp peak 1016 is located at 20.08° for both XRD curve 1012 and XRD curve 1014. The peak at 2θ=20.08 is assigned to (110) (200) reflection from ferroelectric polymer crystals. The peak location, height, and shoulder at low angle side remain constant regardless of the film structure. This result shows that the porous film crystallinity is not affected by the phase separation processing of method 500.

DSC data 1020 include (a) DSC curve 1030 of a solid PVDF-TrFE film such as the film associated with SEM image 710, (b) DSC curve 1040 of an all-porous PVDF-TrFE film such as the film associated with SEM image 720, and (c) DSC curve 1050 of a porous PVDF-TrFE film with a dense surface, such as the film associated with SEM images 730 and 740. DSC curves 1030, 1040, and 1050 are plotted as heat flow 1022 versus temperature 1021. All three samples show two peaks, corresponding to the temperature of phase transition in crystallites ($T_c$) and to temperature of paraelectric phase melting ($T_m$). According to these DSC results, the PVDF solid film and porous films, with or without dense surface, are piezoelectric due to the existence of $\beta$-phase crystallites. No significant differences are observed between the two porous structures (see DSC curves 1040 and 1050). $T_c$ 1032 of solid film was about 2° C. higher than $T_c$ 1042 and $T_c$ 1052 of porous films. $T_m$ 1054 remains at 154° C. for all three structures. This establishes that the presence of pores in the film has no large impact on the phase transition peak temperatures or temperature ranges. On the other hand, the insignificant crystallinity decrease is affected by crystallite constrained in microscale pore structure, resulting in smaller crystal size in porous film compared with solid film.

Figure 11:
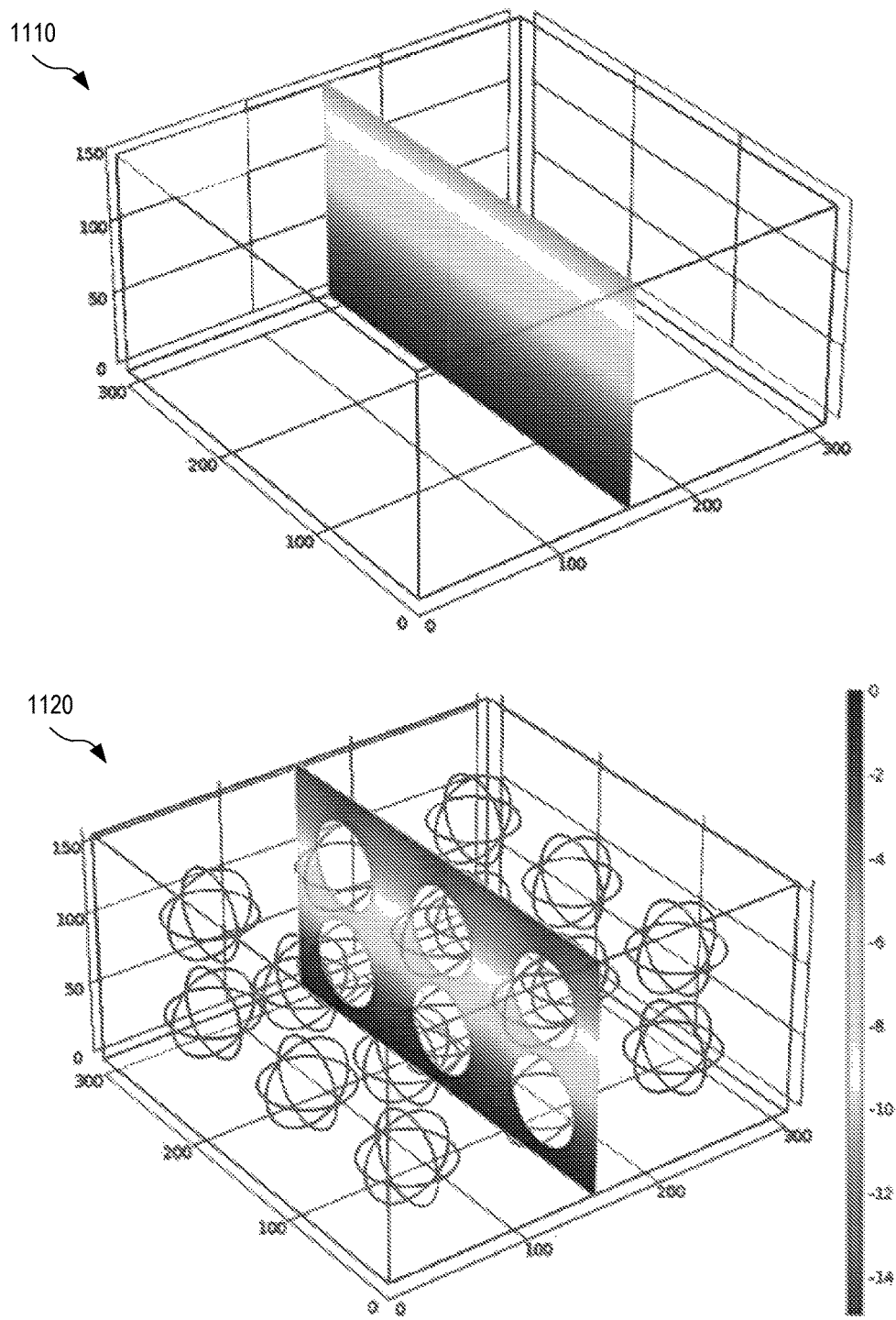
FIG. 11 shows simulated piezoelectric response of a solid film and simulated piezoelectric response of an exemplary porous material having a dense surface.

FIG. 11 shows simulated piezoelectric response 1110 of a solid film and simulated piezoelectric response 1120 of an exemplary porous material having a dense surface, such as porous piezoelectric material 110 (FIG. 1) and the film associated with SEM images 730 and 740 (FIG. 7). The results of FIG. 11 are derived from a finite element model. COMSOL software was used to setup a three-dimensional film model. In the model, uniform electrodes are coated on the top and bottom surfaces and the film is poled in the axial direction. The potential of the bottom electrode is grounded. After structural setup, constant pressure is applied to the top of the device, and the potential profile is extracted. The porous piezoelectric structure used in the finite element model of a 3-3 piezocomposite membrane is indicated in piezoelectric response 1120. This is chosen to be close to the practical structure of a foam-reticulated sample having porosity similar to the present porous PVDF-TrFE film. The volume fraction of the piezocomposite film is taken as 40%, for consistency with the 60% porosity discussed in reference to FIGS. 7 and 8. The maximum piezoelectric response occurs in the porous film with dense surface.

Figure 12:
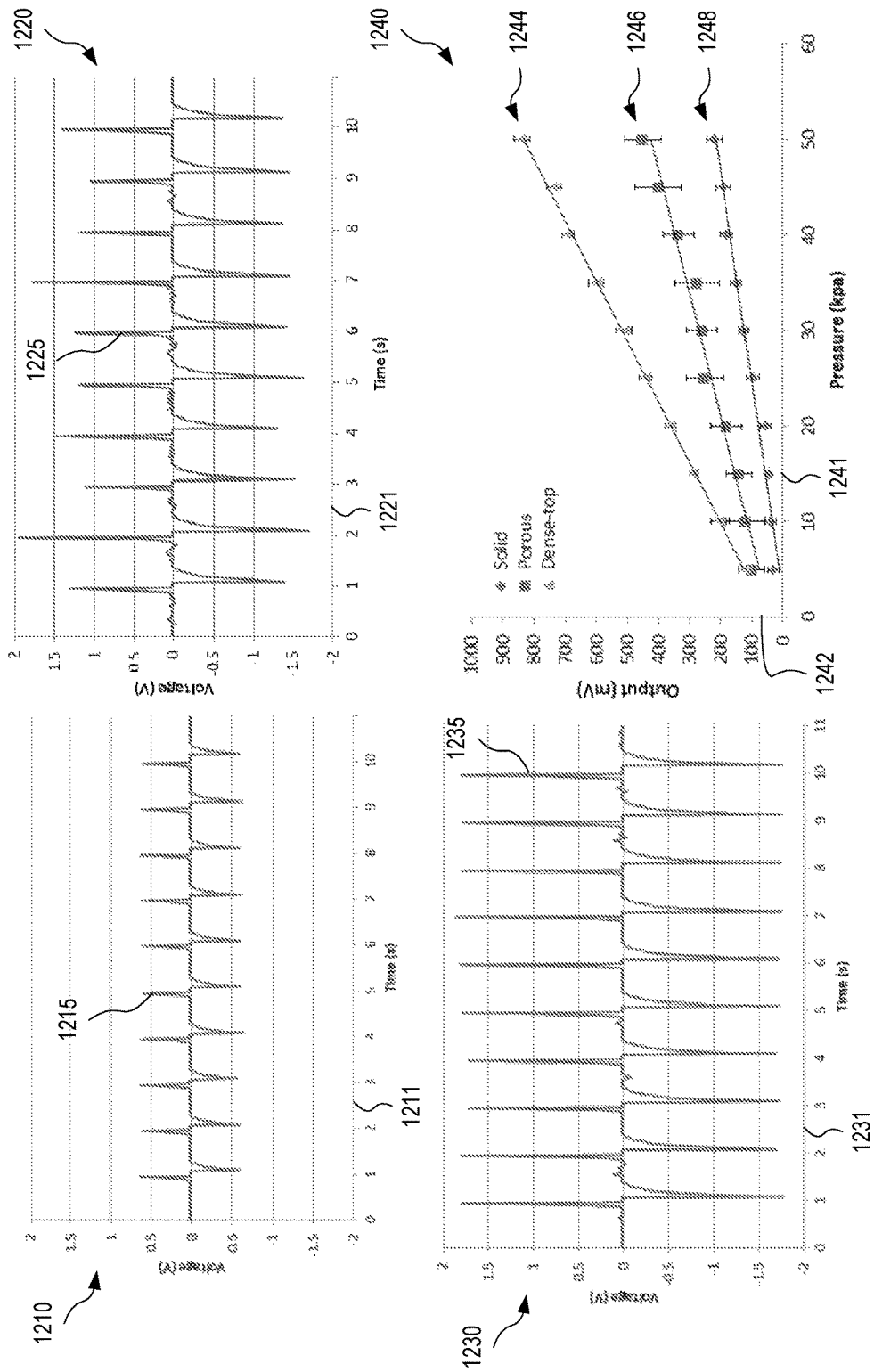
FIG. 12 shows measurement of electrical characteristics of exemplary PVDF-TrFE films of different structures.

FIG. 12 shows measurement plots 1210, 1220, 1230, and 1240 that illustrate electrical characteristics of exemplary PVDF-TrFE films of different structures. Plot 1210 shows measured variations of piezovoltage 1215, as a function of time 1211, in response to pressure over ten deformation cycles for a solid PVDF-TrFE film such as the film associated with SEM image 710 (FIG. 7). Plot 1220 shows measured variations of piezovoltage 1225, as a function of time 1221, in response to pressure over ten deformation cycles for a porous PVDF-TrFE film such as the film associated with SEM image 720 (FIG. 7). Plot 1230 shows measured variations of piezovoltage 1235, as a function of time 1231, in response to pressure over ten deformation cycles for a porous PVDF-TrFE film, with a dense surface, such as the film associated with SEM images 730 and 740 (FIG. 7).

For all of plots 1210, 1220, and 1230, when pressure is applied to the film, piezoelectric charges are generated which build up the potential difference between two electrodes (e.g., electrodes 132 and 134, FIG. 1), and a corresponding peak is observed in the positive voltage direction. When the pressure is released, a negative peak is observed. The positive and negative voltage peaks thus correspond to the compression and recovery, respectively, in the PVDF film.

In the case of porous PVDF film (plot 1220) the generated peak to peak voltage reaches 3.6 V, whereas it is only 1.3 V for solid film (plot 1210). In plots 1210 and 1230, the pressure-induced piezovoltage 1215 and 1235, respectively, of the film is consistent with the load pressure signal, whereas it varies unpredictably in plot 1225. This shows that a porous surface causes unreliable piezovoltage output. With the much higher peak-to-peak voltage of the porous, dense surface film of plot 1230, the sensitivity of a porous film to pressure is much higher than that of solid film (see plot 1210). This remarkable output increase from porous structure may be attributed to the higher compressibility.

Plot 1240 shows piezovoltage 1242 as a function of applied pressure 1241 for (a) a solid PVDF-TrFE film such as the film associated with SEM image 710 (data 1248), (b) a porous PVDF-TrFE film such as the film associated with SEM image 720 (data 1246), and (c) a porous PVDF-TrFE film, with a dense surface, such as the film associated with SEM images 730 and 740 (data 1244). Each of these films is incorporated into a piezoelectric device. In the case of the porous PVDF-TrFE film with a dense surface, this device is an embodiment of piezoelectric device 120 (FIG. 1). The voltage rises proportionally to applied pressure for all devices. The porous film devices, data 1246 and 1244, show higher sensitivity (16 mV/kpa) than the solid film based device (data 1248, 4.2 mV/kpa) at the charge amplifier. The dense-surface porous film (data 1244) shows better linearity than porous film (data 1246). The porous film based devices (data 1246 and 1248) showed higher sensitivity than the thin film based device (data 1248) while at the same time using less than half the piezoelectric material per unit film area. This high sensitivity is also capable of detecting minor pressure fluctuations on the surface, whereas the solid film failed to respond to pressure variations under 10 kPa. Switch polarity test indicates that the signals were obtained due to the piezoelectricity of the film, rather than external electrostatic charges. In summary, a three times higher signal output is produced by the porous film based device with dense surface (data 1244) than by the solid film based device (data 1248), and the porous film based device with dense surface (data 1244) achieves better linearity than the porous film without a dense surface (data 1246). This is quantified by the correlation coefficient between piezovoltage and pressure being 0.991 and 0.982 for the porous film with and without dense surface, respectively.

Figure 13:
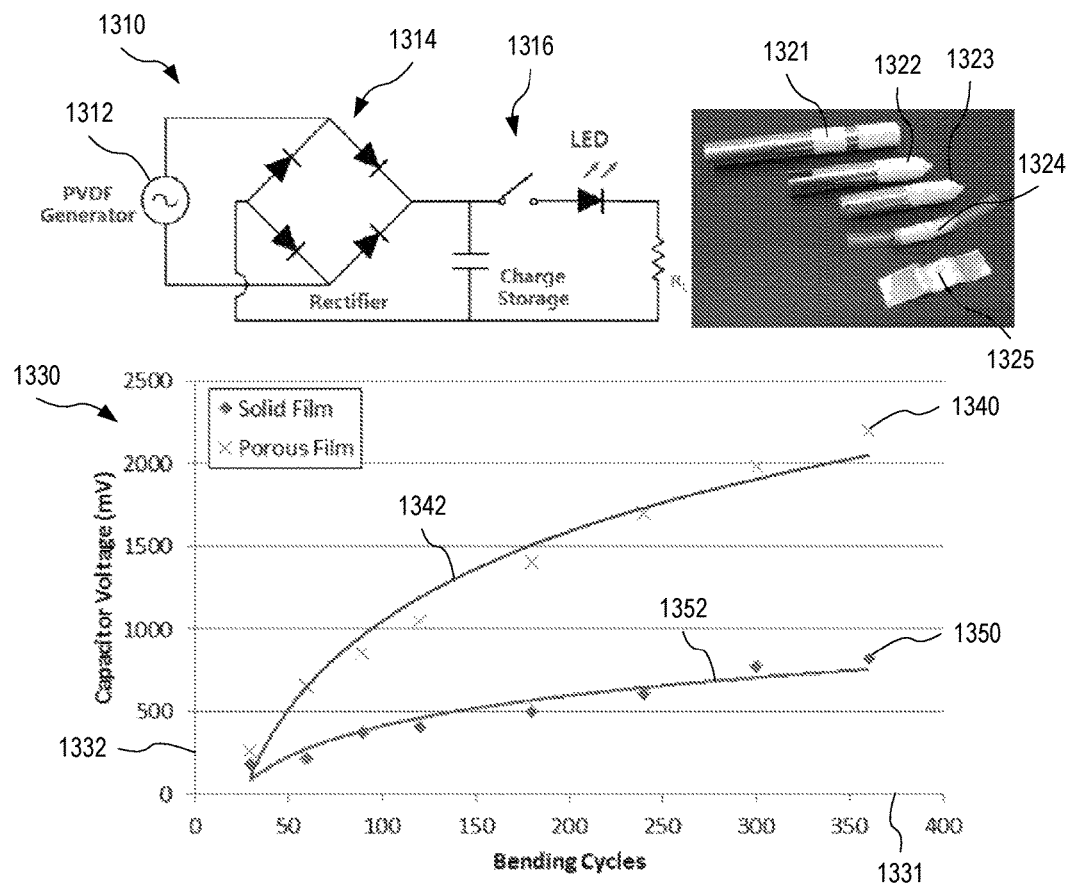
FIG. 13 illustrates properties of nanogenerators based upon a porous PVDF-TrFE film having a dense surface, according to embodiments.

FIG. 13 illustrates properties of nanogenerators based upon a porous PVDF-TrFE film, having a dense surface, such as the film associated with SEM images 730 and 740 (FIG. 7). These nanogenerators are embodiments of piezoelectric device 120 (FIG. 1) that generate electrical power in response to applied mechanical strain.

Diagram 1310 is an electrical circuit diagram for the nanogenerators. The circuit includes (a) the PVDF-TrFE film with electrodes (such as electrodes 132 and 134, FIG. 1), labeled PVDF generator 1312, (b) a full wave bridge rectifier 1314 that rectifies alternating current generated by PVDF generator 1312 to produce a rectified current, and (c) and an output circuit 1316 that receives and utilizes/stores the rectified current from rectifier 1314. Output circuit 1316 includes (a) 2.2 nF capacitor that stores charge generated by PVDF generator 1312 and rectified by rectifier 1314 and (b) an 3 mm sized commercial red LED that is lit by the generated power.

PVDF generator 1312 may be based upon a planar substrate, a curved substrate (see implementations 1321, 1322, 1323, and 1324), and/or a flexible substrate (see implementations 1324 and 1325).

Plot 1330 shows the capacitor voltage 1332 of output circuit as a function of bending cycles for a flexible example of PVDF generator 1312 (e.g., implementation 1324 or 1325). To simulate bending in a real-life application, a rotating motor applied a 1 Hertz bending and release action to a flexible plastic substrate on which PVDF generator 1312 was implemented. The voltage generated across the 4.7 nF capacitor was measured after 2 minutes of continuous vibrations. For the PVDF-TrFE film with dense surface, the generated voltage was 2.2 V (see data points 1340 and curve 1342), whereas for a solid PVDF-TrFE film, the generated voltage was only 0.8V (see data points 1350 and curve 1352). Considering the film surface area (2×0.4 cm), the power density of the porous PVDF film with dense surface reached 8.36 µW/cm$^3$, much higher than that of a conventional PVDF generator based upon a solid PVDF-TrFE film (less than 1.5 µW/cm$^3$ at human motion frequency).

Conclusion

Example I has discussed the compressibility of PVDF microstructures using finite element models and the effects of spatial arrangements on the mechanical sensitivity of microstructured films. Further, Example I disclosed application of these porous films, having a dense surface, as active piezoelectric layer in pressure sensors and energy generators. Performance characteristics, including output voltage and power density, exceeded values for prior art PVDF nanogenerators. For practical use, processing costs for 3D porous piezocomposites will be considerably lower than for high density materials and template-assistant manufacturing. Ease of manufacture, high mechanical sensitivity, and low-cost make porous structure with dense surface an excellent option for piezoelectric devices.

Combinations of Features

Features described above as well as those claimed below may be combined in various ways without departing from the scope hereof. For example, it will be appreciated that aspects of one porous piezoelectric material with dense surface, or associated method or device, described herein may incorporate or swap features of another porous piezoelectric material with dense surface, or associated method or device, described herein. The following examples illustrate possible, non-limiting combinations of embodiments described above. It should be clear that many other changes and modifications may be made to the systems and methods described herein without departing from the spirit and scope of this invention:

(A1) A method for producing a porous piezoelectric polymer film with a dense surface may include (a) depositing, on a substrate, a polymer solution to form a polymer film including a solvent, (b) evaporating a portion of the solvent to form the dense surface, wherein the dense surface is located away from the substrate, (c) forming water droplets in the interior of the polymer film, and (d) substantially evaporating the water droplets and remaining solvent to form porous interior.

(A2) In the method denoted as (A1), the step of forming water droplets may be performed after the step of evaporating a portion of the solvent.

(A3) In either or both of the methods denoted as (A1) and (A2), the porous interior may be more porous than the dense surface.

(A4) In any of the methods denoted as (A1) through (A3), the step of depositing a polymer solution may include depositing a polyvinylidene fluoride solution with the concentration of the polymer in the polymer solution being sufficient to form the porous interior with a substantially uniform pore size.

(A5) In the method denoted as (A4), the concentration may be at least eight weight percent.

(A6) Any of the methods denoted as (A1) through (A5) may further include poling the polymer film to align piezoelectric domains.

(A7) In any of the methods denoted as (A1) through (A6), the step of evaporating a portion of the solvent may include exposing the polymer film to a dry environment to evaporate a portion of the solvent located in a portion of the polymer film associated with the dense surface.

(A8) In any of the methods denoted as (A1) through (A7), the step of depositing a polymer solution may include depositing a polymer solution having a first solvent and a second solvent, wherein the first solvent having lower boiling temperature than the second solvent; and the step of evaporating a portion of the solvent may include evaporating a portion of the first solvent.

(A9) In the method denoted as (A9), the step of forming water droplets may include forming the water droplets while the second solvent is present in the polymer film.

(A10) In any of the methods denoted as (A1) through (A9), the step of forming water droplets may include exposing the polymer film to humidity and condensing water on the dense surface.

(A11) In the method denoted as (A10), the step of depositing a polymer solution may include depositing a polymer solution that includes a solvent with density less than density of water such that at least a portion of the water condensed on the dense surface, in the step of forming water droplets, sinks into the polymer film.

(A12) In either or both of the methods denoted as (A10) and (A11), the step of depositing the polymer solution may include depositing a polymer solution that includes a hydrophilic solvent such that at least a portion of the water condensed on the dense surface, in the step of forming water droplets, is absorbed by the hydrophilic solvent.

(A13) In the method denoted as (A12), the hydrophilic solvent may include dimethylformamide.

(A14) In either or both of the methods denoted as (A12) and (A13), the hydrophilic solvent may include tetrahydrofuran-dimethylformamide.

(A15) In any of the methods denoted as (A1) through (A14), the step of evaporating a portion of the solvent may include forming the dense surface with small pores, wherein the small pores are generally smaller than pores of the porous interior and allow transport of water through the dense surface to the interior.

(A16) In the method denoted as (A15), each of a majority of the small pores may have extent less than four micron.

(A17) In any of the methods denoted as (A1) through (A16), the substrate may be an electrode.

(A18) Any of the methods denoted as (A1) through (A17) may further include depositing an electrode on the dense surface.

(A19) In the method denoted as (A18), the electrode may be in substantially spatially uniform contact with the dense surface.

(B1) A piezoelectric composition may include a piezoelectric material with a porous interior and a dense surface for interfacing with an electrode, wherein the dense surface has density greater than the porous interior.

(B2) In the piezoelectric composition denoted as (B1), the dense surface may be substantially composed of a first material, and the porous interior may be substantially composed of the first material and pores embedded in the first material.

(B3) In the piezoelectric composition denoted as (B2), the first material may include a polymer.

(B4) In the piezoelectric composition denoted as (B3), the first material may be substantially composed of a polymer.

(B5) In either of both of the piezoelectric compositions denoted as (B3) and (B4), the polymer may be selected from the group consisting of polyvinylidene fluoride, derivatives of polyvinylidene fluoride, and polyvinylidenedifluoride-trifluoroethylene.

(B6) In any of the piezoelectric compositions denoted as (B1) through (B5), the piezoelectric material may be a film.

(B7) In any of the piezoelectric compositions denoted as (B1) through (B6), the piezoelectric material may be flexible.

(B8) In any of the piezoelectric compositions denoted as (B1) through (B7), the porous interior may have substantially uniform pore size.

(C1) A piezoelectric device may include (a) a first electrode, (b) a porous piezoelectric film with a dense surface and porous interior, wherein the porous piezoelectric film is deposited on the first electrode and the dense surface is away from the first electrode, and (c) a second electrode deposited on the dense surface for, together with the first electrode, providing an electrical interface for the porous piezoelectric film.

(C2) In the piezoelectric device denoted as (C1), electrical contact between the second electrode and the dense surface may be substantially independent of dynamic dimensional variation of the porous piezoelectric film.

(C3) In either or both of the piezoelectric devices denoted as (C1) and (C2), the second electrode may have extent into the dense surface that is insufficient to produce an electrical short to the first electrode.

(C4) In any of the piezoelectric devices denoted as (C1) through (C3), the porous piezoelectric film and the first and second electrodes may be flexible.

(C5) In any of the piezoelectric devices denoted as (C1) through (C4), the porous piezoelectric film may be a polymer film.

(C6) Any of the piezoelectric devices denoted as (C1) through (C5) may further include electronic circuitry, communicatively coupled with the first and second electrodes, for measuring an electrical property of the porous piezoelectric film indicative of mechanical force exerted on the porous piezoelectric film.

(C7) Any of the piezoelectric devices denoted as (C1) through (C6) may further include electronic circuitry, communicatively coupled with the first and second electrodes, for collecting charge generated by the porous piezoelectric film in response to mechanical force exerted on the porous piezoelectric film.

(C8) Any of the piezoelectric devices denoted as (C1) through (C7) may further include electronic circuitry, communicatively coupled with the first and second electrodes, for applying an electrical condition to the porous piezoelectric film to change a dimensional property of the porous piezoelectric film.

(C9) In any of the piezoelectric devices denoted as (C1) through (C8), the porous interior may have substantially uniform pore size.

Changes may be made in the above compositions, devices, and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present compositions, devices, and methods, which, as a matter of language, might be said to fall therebetween.

What is claimed is:

1. A piezoelectric composition comprising:
   a piezoelectric material including
   a porous interior, and
   a dense surface for interfacing with an electrode, the dense surface having density greater than the porous interior.

2. The piezoelectric composition of claim 1, the dense surface being substantially composed of a first material; and
   the porous interior being substantially composed of the first material and pores embedded in the first material.

3. The piezoelectric composition of claim 2, the first material including a polymer.

4. The piezoelectric composition of claim 2, the first material substantially composed of a polymer.

5. The piezoelectric composition of claim 1, the piezoelectric material being a film.

6. The piezoelectric composition of claim 1, the piezoelectric material being flexible.

7. A piezoelectric device comprising:
   a first electrode;
   a porous piezoelectric film having a dense surface and porous interior, the porous piezoelectric film being deposited on the first electrode such that the dense surface faces away from the first electrode; and
   a second electrode deposited on the dense surface for, together with the first electrode, providing an electrical interface for the porous piezoelectric film.

8. The piezoelectric device of claim 7, electrical contact between the second electrode and the dense surface being substantially independent of dynamic dimensional variation of the porous piezoelectric film.

9. The piezoelectric device of claim 7, the second electrode having extent into the dense surface that is insufficient to produce an electrical short to the first electrode.

10. The piezoelectric device of claim 7, the porous piezoelectric film and the first and second electrodes being flexible.

11. The piezoelectric device of claim 7, the porous piezoelectric film being a polymer film.

12. The piezoelectric device of claim 7, further comprising electronic circuitry, communicatively coupled with the first and second electrodes, for measuring an electrical property of the porous piezoelectric film indicative of mechanical force exerted on the porous piezoelectric film.

13. The piezoelectric device of claim 7, further comprising electronic circuitry, communicatively coupled with the first and second electrodes, for applying an electrical condition to the porous piezoelectric film to change a dimensional property of the porous piezoelectric film.

* * * * *